United States Patent
Wang

(10) Patent No.: US 9,953,611 B2
(45) Date of Patent: Apr. 24, 2018

(54) SHIFT REGISTER AND DRIVING METHOD THEREOF, GATE DRIVING CIRCUIT AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Zheng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/306,833

(22) PCT Filed: Feb. 16, 2016

(86) PCT No.: PCT/CN2016/073841
§ 371 (c)(1),
(2) Date: Oct. 26, 2016

(87) PCT Pub. No.: WO2017/045351
PCT Pub. Date: Mar. 23, 2017

(65) Prior Publication Data
US 2017/0270892 A1    Sep. 21, 2017

(30) Foreign Application Priority Data

Sep. 17, 2015 (CN) .......................... 2015 1 0596058

(51) Int. Cl.
*G09G 5/00*        (2006.01)
*G11C 19/28*       (2006.01)

(52) U.S. Cl.
CPC .............. *G09G 5/003* (2013.01); *G11C 19/28* (2013.01); *G09G 2300/0426* (2013.01);
(Continued)

(58) Field of Classification Search
CPC ..... G11C 19/18; G11C 19/182; G11C 19/184; G11C 19/186; G11C 19/188; G11C 19/28;
(Continued)

(56) References Cited

U.S. PATENT DOCUMENTS

| | | | |
|---|---|---|---|
| 2010/0166136 A1 | 7/2010 | Tobita | |
| 2010/0245337 A1* | 9/2010 | Hu | G09G 3/3677 345/213 |
| 2014/0133621 A1* | 5/2014 | Shang | G11C 19/28 377/67 |

FOREIGN PATENT DOCUMENTS

| CN | 102945650 A | 2/2013 |
|---|---|---|
| CN | 104252853 A | 12/2014 |

(Continued)

OTHER PUBLICATIONS

International Search Report forms 210, 220, 237 dated Jun. 21, 2016 issued in corresponding International Application No. PCT/CN2016/073841 along with English translation of Written Opinion of the International Searching Authority.

*Primary Examiner* — Benjamin C Lee
*Assistant Examiner* — Dong Hui Liang
(74) *Attorney, Agent, or Firm* — Nath, Goldberg & Meyer; Joshua B. Goldberg; Stanley N. Protigal

(57) ABSTRACT

The present application provides a shift register and a driving method thereof, a gate driving circuit and a display device. The shift register includes: an input module for introducing a signal of an output terminal of a previous level shift register to the pull-up node; an output module for introducing a signal of the first clock signal terminal to the output terminal; a reset module for resetting the pull-up node, the output terminal, the first pull-down node, and the second pull-down node using signals of the OFF signal terminal, the first signal terminal, and the second signal (Continued)

terminal; a voltage setting module for introducing a signal of the OFF signal terminal to the first pull-down node and the second pull-down node; and a holding module for introducing signals of the first signal terminal and the second signal terminal to the first pull-down node and the second pull-down node, respectively.

13 Claims, 5 Drawing Sheets

(52) U.S. Cl.
CPC .............. *G09G 2310/0251* (2013.01); *G09G 2310/0267* (2013.01); *G09G 2310/0286* (2013.01); *G09G 2310/0289* (2013.01); *G09G 2310/08* (2013.01); *G09G 2330/023* (2013.01)

(58) Field of Classification Search
CPC ... G11C 19/282; G11C 19/285; G11C 19/287; G09G 2310/0286
See application file for complete search history.

(56) References Cited

FOREIGN PATENT DOCUMENTS

| | | |
|---|---|---|
| CN | 104700812 A | 6/2015 |
| CN | 105118414 A | 12/2015 |
| CN | 204946511 U | 1/2016 |
| KR | 1020080000205 A | 1/2008 |

* cited by examiner

US 9,953,611 B2

SHIFT REGISTER AND DRIVING METHOD THEREOF, GATE DRIVING CIRCUIT AND DISPLAY DEVICE

The present application is the U.S. national phase of PCT Application No. PCT/CN2016/073841, filed on Feb. 16, 2016, which claims priority to Chinese Patent Application No. 201510596058.1, filed on Sep. 17, 2015, the disclosure of which is hereby incorporated by reference in its entirety

TECHNICAL FIELD

The present application belongs to the field of gate driving technology, and in particular relates to a shift register and a driving method thereof, a gate driving circuit and a display device.

BACKGROUND

An array substrate is one of important parts of a display device (a liquid crystal display device, an organic light emitting diode display device, etc.). An array substrate includes a plurality of gate lines through which ON-signals alternately flow. In order to drive the gate lines, a current method is to use a gate driver on array (GOA), that is, to prepare a circuit for driving the gate lines in the array substrate. A gate driving circuit is generally formed by a plurality of cascaded sift registers, each of which is used for driving one gate line.

FIG. 1 illustrates a current sift register comprising a plurality of transistors, a capacitor and the like. It can be seen from FIG. 1 that an electrical level of a pull-down node PD of the shift register is controlled by a second clock signal terminal CLKB through a transistor M; and the pull-down node PD is also connected to a plurality of other transistors which all have certain parasitic capacitances, parasitic resistances and the like. Therefore, when a signal from the second clock signal terminal CLKB pulls the electrical level of the pull-down node PD so that it changes (e.g. from low to high), a relatively high power consumption may occur, thereby resulting in a relatively long delay. Especially, signals of the second clock signal terminals CLKB of a plurality of shift registers are generally provided by a same port, so power consumptions of respective sift registers are superimposed over one another, resulting in a significant delay of the signal of second clock signal terminal CLKB in the end, influencing a display effect, generating a very large power consumption and wasting energy.

SUMMARY

In view of the problem of long delay and large power consumption in a shift register of a current gate driving circuit, the present application provides a shift register that can reduce delay and power consumption and a driving method thereof, a gate driving circuit and a display device.

In a first aspect of the present application, there is provided a shift register, comprising a pull-up node, a first pull-down node, a second pull-down node, a first clock signal terminal, a second clock signal terminal, a first signal terminal, a second signal terminal, an OFF signal terminal, and an output terminal, wherein the shift register further comprises:

an input module, used for introducing a signal of an output terminal of a previous level shift register to the pull-up node;

an output module, used for introducing, based on an electrical level of the pull-up node, a signal of the first clock signal terminal to the output terminal;

a reset module, used for resetting, under the control of a signal of an output terminal of a next level shift register, the pull-up node, the output terminal, the first pull-down node, and the second pull-down node using signals of the OFF signal terminal, the first signal terminal, and the second signal terminal;

a voltage setting module, used for introducing, based on an electrical level of the pull-up node, a signal of the OFF signal terminal to the first pull-down node and the second pull-down node; and a holding module, for introducing, under the control of the second clock signal terminal, signals of the first signal terminal and the second signal terminal to the first pull-down node and the second pull-down node, respectively, so as to introduce a signal of the OFF signal terminal into the pull-up node and the output terminal.

Preferably, the input module comprises: a first transistor having a gate and a first electrode connected to the output terminal of the previous level shift register and a second electrode connected to the pull-up node.

More preferably, the output module comprises: a third transistor having a gate connected to the pull-up node, a first electrode connected to the first clock signal terminal, and a second electrode connected to the output terminal; and a storage capacitor C having a first terminal connected to the pull-up node, and a second electrode connected to the output terminal.

More preferably, the reset module comprises: a second transistor having a gate connected to the output terminal of the next level shift register, a first electrode connected to the pull-up node, and a second electrode connected to the OFF signal terminal; a fourth transistor having a gate connected to the output terminal of the next level shift register, a first electrode connected to the output terminal, and a second electrode connected to the OFF signal terminal; a seventh transistor having a gate connected to the output terminal of the next level shift register, a first electrode connected to the first signal terminal, and a second electrode connected to the first pull-down node; and an eighth transistor having a gate connected to the output terminal of the next level shift register, a first electrode connected to the second signal terminal, and a second electrode connected to the second pull-down node.

More preferably, the voltage setting module comprises: a ninth transistor having a gate connected to the pull-up node, a first electrode connected to the first pull-down node, and a second electrode connected to the OFF signal terminal; and a tenth transistor having a gate connected to the pull-up node, a first electrode connected to the second pull-down node, and a second electrode connected to the OFF signal terminal.

More preferably, the holding module comprises: a fifth transistor having a gate connected to the second clock signal terminal, a first electrode connected to the first signal terminal, and a second electrode connected to the first pull-down node; a sixth transistor having a gate connected to the second clock signal terminal, a first electrode connected to the second signal terminal, and a second electrode connected to the second pull-down node; a eleventh transistor having a gate connected to the first pull-down node, a first electrode connected to the pull-up node, and a second electrode connected to the OFF signal terminal; a twelfth transistor T12 having a gate connected to the first pull-down node, a first electrode connected to the output terminal, and a second electrode connected to the OFF signal terminal; a thirteenth transistor having a gate connected to the second pull-down node, a first electrode connected to the pull-up node, and a second electrode connected to OFF signal terminal; and a fourteenth transistor having a gate connected to the second pull-down node, a first electrode connected to the output terminal, and a second electrode connected to the OFF signal terminal.

More preferably, a parasitic resistance of the ninth transistor is smaller than a parasitic resistance of the fifth transistor; and a parasitic resistance of the tenth transistor is smaller than a parasitic resistance of the sixth transistor.

More preferably, all of the transistors are N-type transistors.

Alternatively, all of the transistors are P-type transistors.

A second aspect of the present application provides a gate driving circuit, comprising a plurality of cascaded shift registers described above.

A third aspect of the present application provides a display device, comprising an array substrate, and the array substrate comprises the above gate driving circuit.

A fourth aspect of the present application provides a driving method of the above shift register, comprising:

in a charging stage, introducing a signal of the output terminal of the previous level shift register to the pull-up node by the input module;

in an output stage, introducing a signal of the first clock signal terminal to the output terminal by the output module, so that the output terminal outputs an ON signal;

in a reset stage, resetting the pull-up node, the output terminal, the first pull-down node, and the second pull-down node using signals of the OFF signal terminal, the first signal terminal, and the second signal terminal by the reset module; and in a holding stage, introducing a signal of the OFF signal terminal to the pull-up node and the output terminal by the holding module, so that the output terminal continuously outputs an OFF signal.

Preferably, in a case where all the above transistors are N-type transistors, the driving method of the shift register comprises: in the charging stage, setting the first clock signal terminal at a low level, the second clock signal terminal at a high level, the output terminal of the previous level shift register at a high level, and the output terminal of the next level shift register at a low level; in the output stage, setting the first clock signal terminal at a high level, the second clock signal terminal at a low level, the output terminal of the previous level shift register at a low level, and the output terminal of the next level shift register at a low level; in the reset stage, setting the first clock signal terminal at a low level, the second clock signal terminal at a high level, the output terminal of the previous level shift register at a low level, and the output terminal of the next level shift register at a high level; and in the holding stage, setting the output terminal of the previous level shift register and the output terminal of the next level shift register at low levels; in the above steps, the OFF signal terminal is continuously at a low level, and one of the first signal terminal and the second signal terminal is at a high level, the other at a low level.

Preferably, in a case where all the above transistors are P-type transistors, the driving method of the shift register comprises: in the charging stage, setting the first clock signal terminal at a high level, the second clock signal terminal at a low level, the output terminal of the previous level shift register at a low level, and the output terminal of the next level shift register at a high level; in the output stage, setting the first clock signal terminal at a low level, the second clock signal terminal at a high level, the output terminal of the previous level shift register at a high level, and the output terminal of the next level shift register at a high level; in the reset stage, setting the first clock signal terminal at a high level, the second clock signal terminal at a low level, the output terminal of the previous level shift register at a high level, and the output terminal of the next level shift register at a low h level; and in the holding stage, setting the output terminal of the previous level shift register and the output terminal of the next level shift register at high levels; in the above steps, the OFF signal terminal is continuously at a high level, and one of the first signal terminal and the second signal terminal is at a high level, the other at a low level.

More preferably, the driving method of the shift register further comprises: a step of switching the level of the first signal terminal and the level of the second signal terminal, such that one of the first signal terminal and the second signal terminal that is at a high level becomes at a low level, and the other that is at a low level becomes at a high level.

In the shift register of the present application, a small number of transistors are connected to a clock signal, thus delay and energy consumption thereof are both low; and the clock signal does not control an electrical level of each node directly, but controls the electrical level of each node through stable signals of a first signal terminal, a second signal terminal and the like, thus an influence of the clock signal on a display effect is little even if there is delay, which can ensure stable operation of the sift register and improve the display effect.

REFERENCE NUMERALS

T1: first transistor; T2: second transistor; T3: third transistor; T4: fourth transistor; T5: fifth transistor; T6: sixth transistor; T7: seventh transistor; T8: eighth transistor; T9: ninth transistor; T10: tenth transistor; T11: eleventh transistor; T12: twelfth transistor; T13: thirteenth transistor; T14: fourteenth transistor; M: transistor; C: storage capacitor; Output (N−1): output terminal of previous level shift register; Output (N+1): output terminal of next level shift register; Output N: output terminal; Vdd1: first signal terminal; Vdd2: second signal terminal; Vss: OFF signal terminal; CLK: first clock signal terminal; CLKB: second clock signal terminal; PU: pull-up node; PD1: first pull-down node; PD2: second pull-down node.

DETAILED DESCRIPTION

In order to provide a better understanding of the technical solutions of the present application to those skilled in the art, the application is described in further detail below in conjunction with the drawings and specific implementations.

First Embodiment

Figure 1:
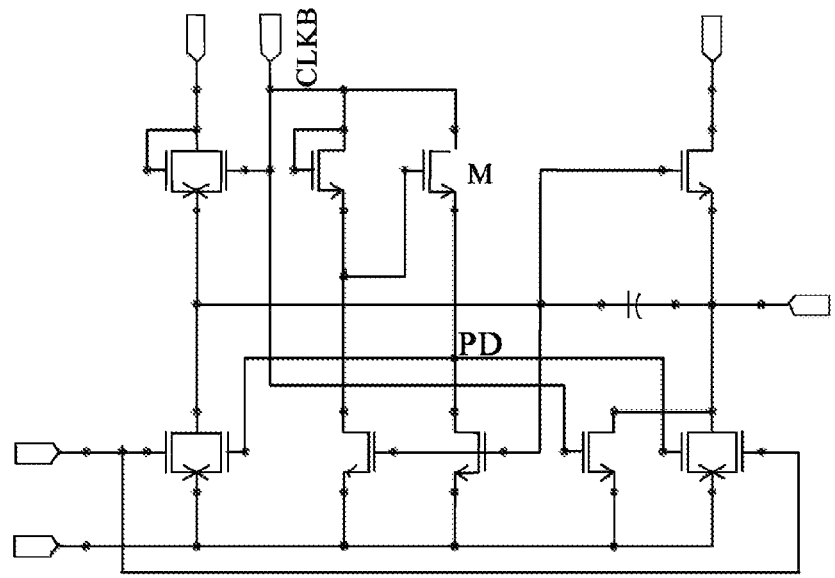
FIG. 1 is a circuit diagram of a current shift register.
Figure 2:
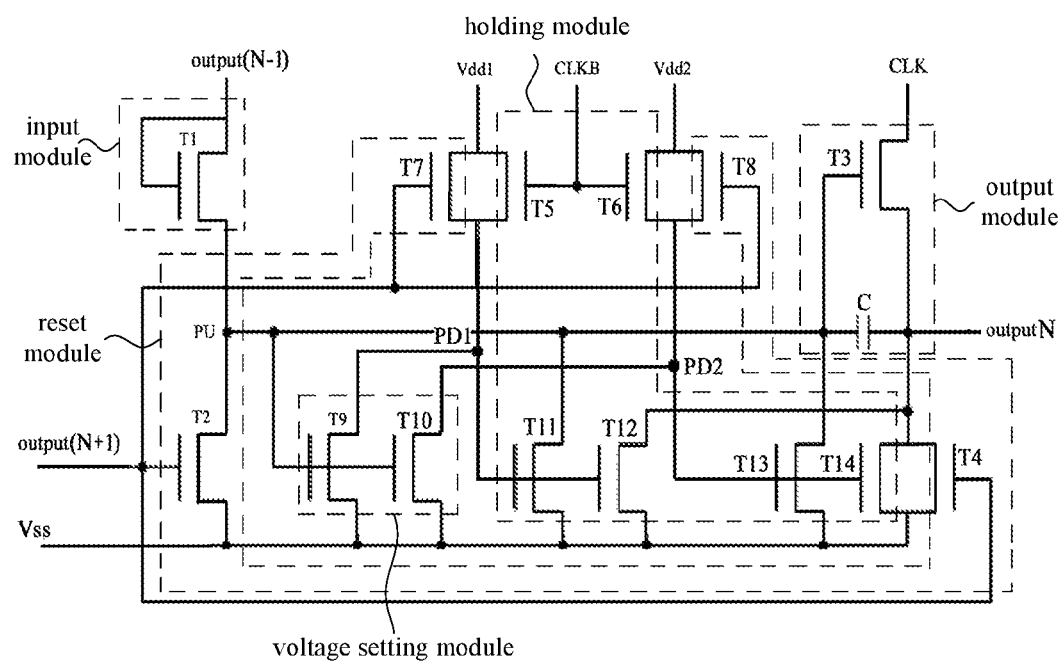
FIG. 2 is a circuit diagram of a shift register of an embodiment of the present application.
Figure 3:
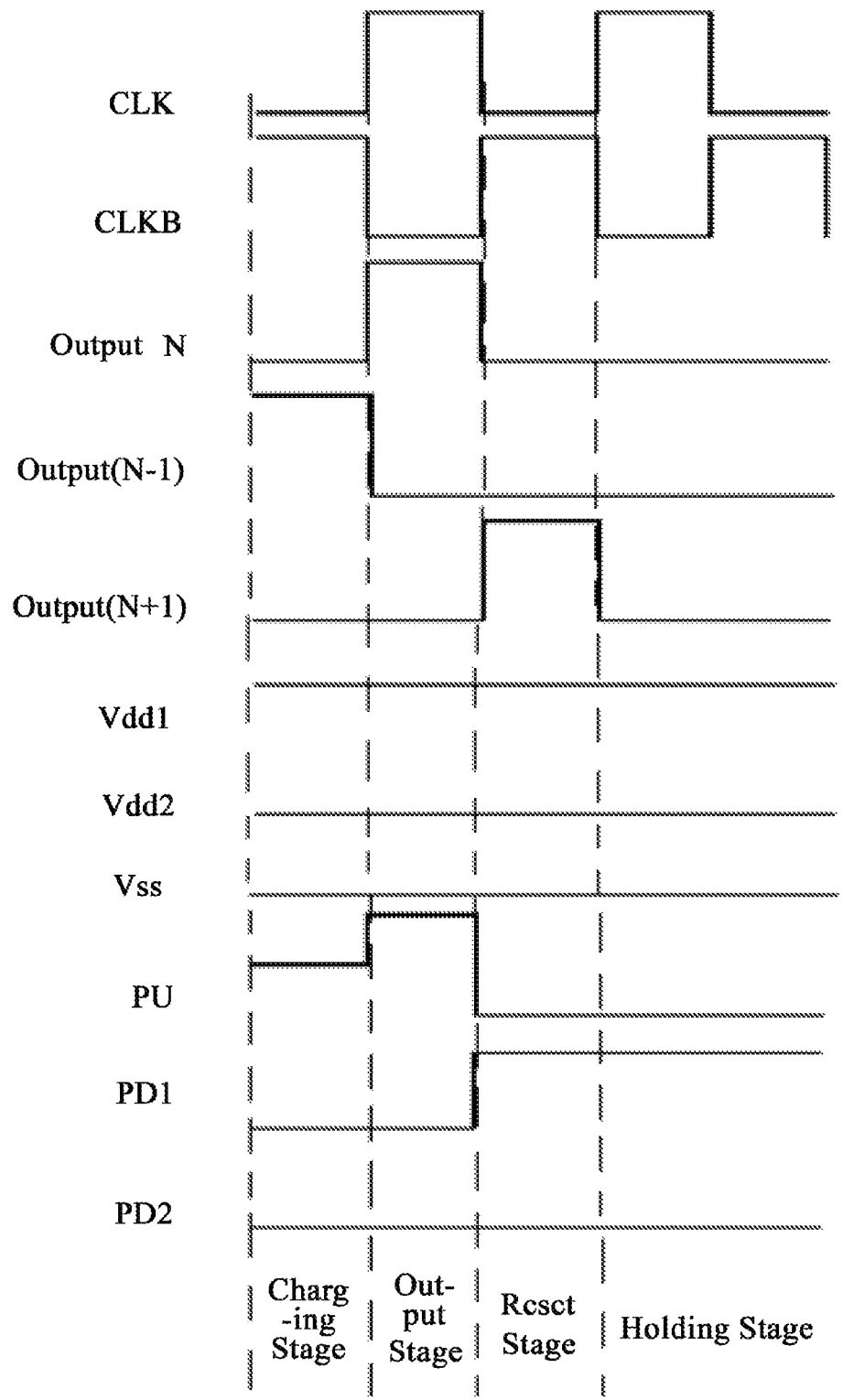
FIG. 3 is a timing diagram for driving the shift register of FIG. 2.

As shown in FIGS. 2 and 3, the present embodiment provides a shift register including a pull-up node PU, a first pull-down node PD1, a second pull-down node PD2, a first clock signal terminal CLK, a second clock signal terminal CLKB, a first signal terminal Vdd1, a second signal terminal Vdd2, an OFF signal terminal Vss, and an output terminal Output N. The shift register further includes:

an input module, used for introducing a signal of an output terminal Output (N−1) of a previous level shift register to the pull-up node PU;

an output module, used for introducing a signal of the first clock signal terminal CLK to the output terminal Output N based on an electrical level of the pull-up node PU;

a reset module, used for resetting the pull-up node PU, the output terminal Output N, the first pull-down node PD1, and the second pull-down node PD2 using signals of the OFF signal terminal Vss, the first signal terminal Vdd1, and the second signal terminal Vdd2 under the control of a signal of an output terminal Output (N+1) of a next level shift register;

a voltage setting module, used for introducing a signal of the OFF signal terminal Vss to the first pull-down node PD1 and the second pull-down node PD2 based on an electrical level of the pull-up node PU; and a holding module, used for introducing signals of the first signal terminal Vdd1 and the second signal terminal Vdd2 to the first pull-down node PD1 and the second pull-down node PD2, respectively, under the control of the second clock signal terminal CLKB, so as to introduce a signal of the OFF signal terminal Vss to the pull-up node PU and the output terminal Output N.

In the shift register of the present embodiment, a small number of transistors are connected to each clock signal, thus delay and energy consumption thereof are both low; and the clock signal does not control an electrical level of each node directly, but controls the electrical level of each node through stable signals of a first signal terminal Vdd1, a second signal terminal Vdd2 and the like, thus an influence of the clock signal on a display effect is little even if there is delay, which can ensure stable operation of the sift register runs stably and improves the display effect.

Preferably, the input module includes: a first transistor T1, a gate and a first electrode of which are connected to the output terminal Output (N−1) of the previous level shift register, and a second electrode of which is connected to the pull-up node PU.

More preferably, the output module includes: a third transistor T3, a gate of which is connected to the pull-up node PU, a first electrode of which is connected to the first clock signal terminal CLK, and a second electrode of which is connected to the output terminal Output N; and a storage capacitor C, a first electrode of which is connected to the pull-up node PU, and a second electrode of which is connected to the output terminal Output N.

More preferably, the reset module includes:

a second transistor T2, a gate of which is connected to the output terminal Output (N+1) of the next level shift register, a first electrode of which is connected to the pull-up node PU, and a second electrode of which is connected to the OFF signal terminal Vss;

a fourth transistor T4, a gate of which is connected to the output terminal Output (N+1) of the next level shift register, a first electrode of which is connected to the output terminal Output N, and a second electrode of which is connected to the OFF signal terminal Vss;

a seventh transistor T7, a gate of which is connected to the output terminal Output (N+1) of the next level shift register, a first electrode of which is connected to the first signal terminal Vdd1, and a second electrode of which is connected to the first pull-down node PD1; and an eighth transistor T8, a gate of which is connected to the output terminal Output (N+1) of the next level shift register, a first electrode of which is connected to the second signal terminal Vdd2, and a second electrode of which is connected to the second pull-down node PD2.

More optionally, the voltage setting module includes:

a ninth transistor T9, a gate of which is connected to the pull-up node PU, a first electrode of which is connected to the first pull-down node PD1, and a second electrode of which is connected to the OFF signal terminal Vss; and a tenth transistor T10, a gate of which is connected to the pull-up node PU, a first electrode of which is connected to the second pull-down node PD2, and a second electrode of which is connected to the OFF signal terminal Vss.

More preferably, the holding module includes:

a fifth transistor T5, a gate of which is connected to the second clock signal terminal CLKB, a first electrode of which is connected to the first signal terminal Vdd1, and a second electrode of which is connected to the first pull-down node PD1;

a sixth transistor T6, a gate of which is connected to the second clock signal terminal CLKB, a first electrode of which is connected to the second signal terminal Vdd2, and a second electrode of which is connected to the second pull-down node PD2;

an eleventh transistor T11, a gate of which is connected to the first pull-down node PD1, a first electrode of which is connected to the pull-up node PU, and a second electrode of which is connected to the OFF signal terminal Vss;

a twelfth transistor T12, a gate of which is connected to the first pull-down node PD1, a first electrode of which is connected to the output terminal Output N, and a second electrode of which is connected to the OFF signal terminal Vss;

a thirteenth transistor T13, a gate of which is connected to the second pull-down node PD2, a first electrode of which is connected to the pull-up node PU, and a second electrode of which is connected to OFF signal terminal Vss; and a fourteenth transistor T14, a gate of which is connected to the second pull-down node PD2, a first electrode of which is connected to the output terminal Output N, and a second electrode of which is connected to the OFF signal terminal Vss.

More preferably, a parasitic resistance of the ninth transistor T9 is smaller than a parasitic resistance of the fifth transistor T5; a parasitic resistance of the tenth transistor T10 is smaller than a parasitic resistance of the sixth transistor T6.

More preferably, all of the transistors are N-type transistors (e.g. all of them are N-type thin-film transistors).

The present embodiment further provides a driving method of the above shift register, including the following steps:

in a charging stage, introducing a signal of an output terminal Output (N−1) of a previous level shift register to the pull-up node PU by an input module;

in an output stage, introducing a signal of the first clock signal terminal CLK to the output terminal Output N by an output module, so that the output terminal Output N outputs an ON signal;

in a reset stage, resetting the pull-up node PU, the output terminal Output N, the first pull-down node PD1, and the second pull-down node PD2 using signals of the OFF signal terminal Vss, the first signal terminal Vdd1, and the second signal terminal Vdd2 by a reset module; and in a holding stage, introducing a signal of the OFF signal terminal Vss to the pull-up node PU and the output terminal Output N by a holding module, so that the output terminal Output N continuously outputs an OFF signal.

In one example, for the above shift register in which all the transistors are N-type transistors, the OFF signal terminal Vss is continuously of low level, and one of the first signal terminal Vdd1 and the second signal terminal Vdd2 is of high level, and the other is of low level.

That is, in this example, the OFF signal terminal Vss must be always in a low-level state (because an N-type transistor is off at a low level); and at any moment, one of the first signal terminal Vdd1 and the second signal terminal Vdd2 must be in a high-level state, whereas the other must be in a low-level state. Specifically, the present embodiment is described by taking a case in which the first signal terminal Vdd1 is always of high level and the second signal terminal Vdd2 is always of low level as an example, and other cases will be described subsequently.

As shown in FIG. 3, in this case, the driving method of the shift register specifically includes the steps as follows.

S11: In the charging stage, the first clock signal terminal CLK is set at a low level, the second clock signal terminal CLKB is set at a high level, the output terminal Output (N−1) of the previous level shift register is set at a high level, and the output terminal Output (N+1) of the next level shift register is set at a low level.

In this stage, the output terminal Output (N+1) of the next level shift register is set at a low level, thus the second transistor T2, the fourth transistor T4, the seventh transistor T7, and the eighth transistor T8 are all turned off; therefore the first transistor T1 is turned on by the high level of the output terminal Output (N−1) of the previous level shift register, the pull-up node PU becomes at a high level, and in turn the third transistor T3, the ninth transistor T9, and the tenth transistor T10 are turned on, and the first electrode (left-side electrode) of the storage capacitor C is set at a high level; and the second electrode (right-side electrode) of the storage capacitor C (which is the output terminal Output N) is set at a low level by the low level of the first clock signal terminal CLK via the third transistor T3, such that the shift register outputs an Off signal (low level), and a certain level difference is generated across the storage capacitor C.

Meanwhile, since the second clock signal terminal CLKB is at a high level, the low level of the second signal terminal Vdd2 is introduced to the second pull-down node PD2 via the sixth transistor T6, and the low level of the OFF signal terminal Vss is also introduced to the second pull-down node PD2 via the tenth transistor T10, to stabilize the low level thereof. As for the first pull-down node PD1, one terminal thereof is connected to the high level of the first signal terminal Vdd1 via the fifth transistor T5, and the other terminal thereof is connected to the low level of the OFF signal terminal Vss via the ninth transistor T9, thus at this time the level of the first pull-down node PD1 is determined by voltage division between the ninth transistor T9 and the fifth transistor T5. Since the parasitic resistance of the ninth transistor T9 is smaller than the parasitic resistance of the fifth transistor T5, voltage division across the ninth transistor T9 is small, and the first pull-down node PD1 has a level closer to the level of the OFF signal terminal Vss and can be seen as at a low level. It is to be understood that when the first clock signal terminal CLK is at a low level and the second clock signal terminal CLKB is at a high level, the second pull-down node PD2 is in a state similar to that of the first pull-down node PD1, that is, the level of the second pull-down node PD2 is determined by voltage division between the tenth transistor T10 and the sixth transistor T6. Since the parasitic resistance of the tenth transistor T10 is smaller than the parasitic resistance of the sixth transistor T6, in this case, the second pull-down node PD2 should be at a low level as well. Thus, the eleventh transistor T11, the twelfth transistor T12, the thirteenth transistor T13, and the fourteenth transistor T14 are all turned off, and has no influence on the pull-up node PU, ensuing stability of the circuit.

S12: In the output stage, the first clock signal terminal CLK is set at a high level, the second clock signal terminal CLKB is set at a low level, the output terminal Output (N−1) of the previous level shift register is set at a low level, and the output terminal Output (N+1) of the next level shift register is set at a low level.

In this stage, the output terminal Output (N−1) of the previous level shift register changes to a low level, thus the first transistor T1 is turned off. The second clock signal terminal CLKB changes to a low level, thus signals of the fifth transistor T5, the sixth transistor T6, the first signal terminal Vdd1 and the second signal terminal Vdd2 can no longer enter the circuit, the first pull-down node PD1 and the second pull-down node PD2 keep at the low level of the OFF signal terminal Vss, and the eleventh transistor T11, the twelfth transistor T12, the thirteenth transistor T13, and the fourteenth transistor T14 remain off, so that the pull-up node PU is floating and remains at a high level. In this manner, the third transistor T3 remains on, and the high level of the first clock signal terminal CLK is introduced to the output terminal Output N, so that the output terminal Output N outputs an ON signal (high level).

Meanwhile, the level of the pull-up node PU is further raised by a bootstrap effect of the storage capacitor C, so that the third transistor T3 remains on more reliably, which stabilizes the output of the ON signal.

S13: In the reset stage, the first clock signal terminal CLK is set at a low level, the second clock signal terminal CLKB is set at a high level, the output terminal Output (N−1) of the previous level shift register is set at a low level, and the output terminal Output (N+1) of the next level shift register is set at a high level.

In this stage, the output terminal Output (N+1) of the next level shift register is at a high level, which turns on the second transistor T2, the fourth transistor T4, the seventh transistor T7, and the eighth transistor T8, such that the second transistor T2 introduces the low level of the OFF signal terminal Vss to the pull-up node PU, and the fourth transistor T4 introduces the low level of the OFF signal terminal Vss to the output terminal Output N, causing the shift register to stably output an OFF signal (low level), and resetting levels at both terminals of the storage capacitor C.

Meanwhile, the high level of the first signal terminal Vdd1 is introduced to the first pull-down node PD1 via the seventh transistor T7, the low level of the second signal terminal Vdd2 is introduced to the second pull-down node PD2 via the eighth transistor T8, and the eleventh transistor T11 and the twelfth transistor T12 are turned on, to assist the second transistor T2 and the fourth transistor T4 to introduce the low level of the OFF signal terminal Vss to the pull-up node PU and the output terminal Output N, thereby producing an effect of reducing noise, and by best controlling the levels of these two nodes, a stable output effect is obtained. Moreover, at this time the second clock signal terminal CLKB is at a high level, which turns on the fifth transistor T5 and the sixth transistor T6 as well, to assist the seventh transistor T7 and the eighth transistor T8 to deliver signals, thereby increasing stability of the circuit.

In this stage, the low level of the OFF signal terminal Vss is introduced to both terminals of the storage capacitor C by multiple different transistors, so as to well ensure stability of low levels at both terminals of the storage capacitor C, and improve an output effect.

S14: In the holding stage, the output terminal Output (N−1) of the previous level shift register and the output terminal Output (N+1) of the next level shift register are set at low levels.

In this stage, the output terminal Output (N−1) of the previous level shift register and the output terminal Output (N+1) of the previous next shift register are both at low levels, so that the first transistor T1, the second transistor T2, the fourth transistor T4, the seventh transistor T7, and the eighth transistor T8 are all turned off, the pull-up node PU is kept at a low level, which turns off the ninth transistor T9 and the tenth transistor T10 as well.

Meanwhile, the second clock signal terminal CLKB switches between a high level and a low level. When the second clock signal terminal CLKB is at a high level, the fifth transistor T5 is turned on, the high level of the first signal terminal Vdd1 is introduced to first pull-down node PD1, the eleventh transistor T11 and the twelfth transistor T12 are turned on, and the low level of the OFF signal terminal Vss is introduced to both terminals of the storage capacitor C, so that the shift register outputs an OFF signal (low level). When the second clock signal terminal CLKB is at a low level, the fifth transistor T5 is turned off, and the first pull-down node PD1 is floating. Because of effects of parasitic capacitances of various components in the circuit and fast signal switching of the second clock signal terminal CLKB, for the short time when the second clock signal terminal CLKB is at a low level, the first pull-down node PD1 is still kept at a high level that can turn the eleventh transistor T11 and the twelfth transistor T12 on, which in turn causes the shift register to continuously output an OFF signal (low level).

In this stage, a low-level signal is introduced to both terminals of the storage capacitor C via the eleventh transistor T11 and the twelfth transistor T12, thereby achieving an effect of reducing noise and stabilizing the output to the largest extent.

Preferably, the above driving method of the shift register further includes a step of switching the levels of the first signal terminal Vdd1 and the second signal terminal Vdd2, that is, switching one of the first signal terminal Vdd1 and the second signal terminal Vdd2 that is at a high level to be at a low level and switching the other that is at a low level to be at a high level.

It can be seen from the above description that in a case in which the first signal terminal Vdd1 is at a high level and the second signal terminal Vdd2 is at a low level, only the first pull-down node PD1 is likely at a high level, and the second pull-down node PD2 is always kept at a low level. That is, only the eleventh transistor T11 and the twelfth transistor T12 corresponding to the first signal terminal Vdd1 may be in a turned-on state, whereas the thirteenth transistor T13 and the fourteenth transistor T14 corresponding to the second signal terminal Vdd2 (the second pull-down node PD2) are always turned off and actually in a non-working "standby" state.

It can be seen from FIG. 3 that structures corresponding to the first signal terminal Vdd1 and the second signal terminal Vdd2 are actually completely equivalent, thus when the second signal terminal Vdd2 is at a high level and the first signal terminal Vdd1 is at a low level, the application can still be implemented in the exactly same way, except that the state of the first pull-down node PD1 and the state of the second pull-down node PD2 are interchanged, and states of the eleventh transistor T11 and the twelfth transistor T12 and states of the thirteenth transistor T13 and the fourteenth transistor T14 are interchanged.

Thus, in order to alternately use transistors corresponding to the first signal terminal Vdd1 and the second signal terminal Vdd2 to extend their service lives, preferably the states of the first signal terminal Vdd1 and the second signal terminal Vdd2 may be switched once in a while.

Of course, although the above switching can be performed at any moment, in order to ensure the stability of the circuit and to reduce difficulty of the switching, preferably the switching is performed at long intervals, for example, the switching is performed at intervals of several to hundreds of frames of pictures, and a specific time interval may be between 0.1 seconds to 10 seconds.

Second Embodiment

Figure 4:
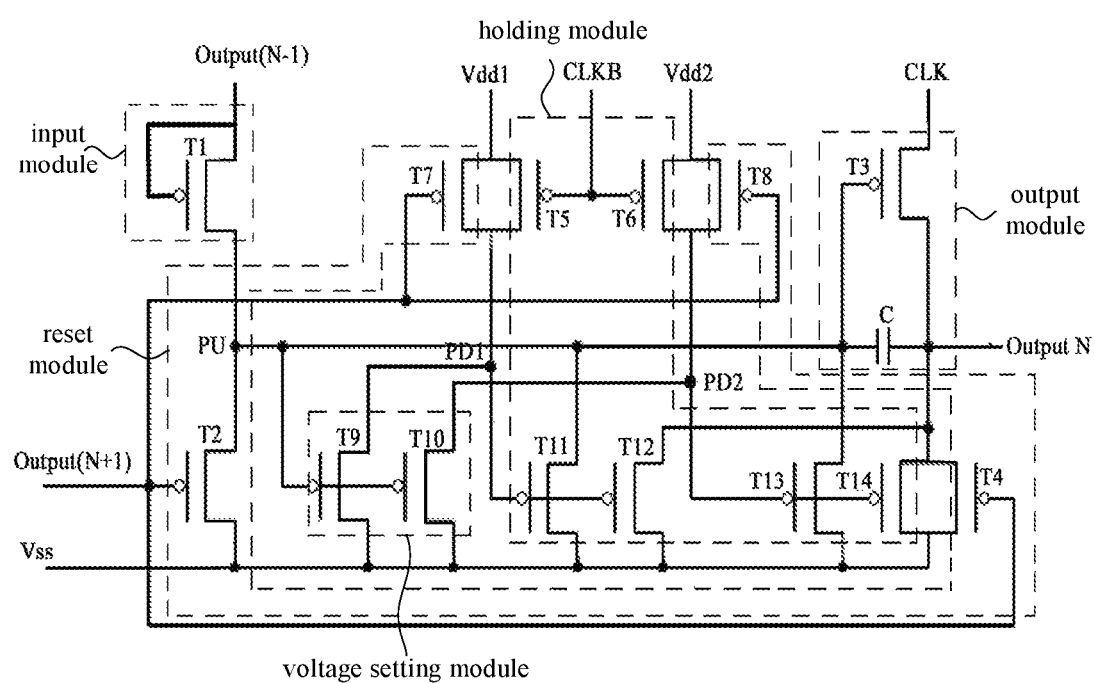
FIG. 4 is a circuit diagram of a shift register of another embodiment of the present application.
Figure 5:
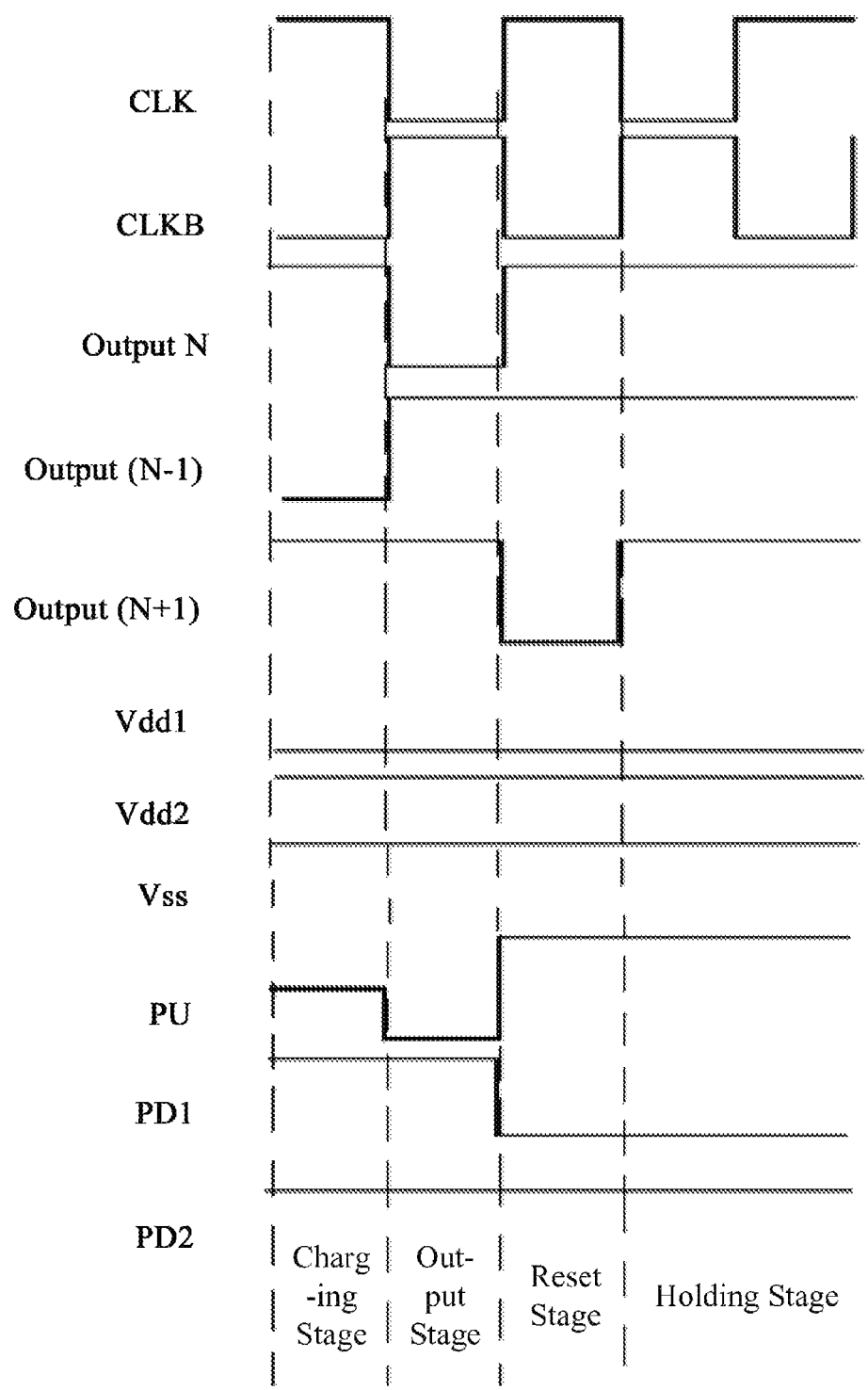
FIG. 5 is a timing diagram for driving the shift register of FIG. 4.

As shown in FIGS. 4 and 5, the present embodiment provides a shift register.

Specifically, the shift register has a structure similar to that of the shift register of the first embodiment, with a difference that all the transistors therein are P-type transistors.

The present embodiment also provides a driving method of the above shift register, including:

S21: in a charging stage, setting the first clock signal terminal CLK at a high level, the second clock signal terminal CLKB at a low level, the output terminal Output (N−1) of the previous level shift register at a low level, and the output terminal Output (N+1) of the next level shift register at a high level;

S22: in an output stage, setting the first clock signal terminal CLK at a low level, the second clock signal terminal CLKB at a high level, the output terminal Output (N−1) of the previous level shift register at a high level, and the output terminal Output (N+1) of the next level shift register at a high level;

S23: in a reset stage, setting the first clock signal terminal CLK at a high level, the second clock signal terminal CLKB at a low level, the output terminal Output (N−1) of the previous level shift register at a high level, and the output terminal Output (N+1) of the next level shift register at a low level; and S24: in a holding stage, setting both the output terminal Output (N−1) of the previous level shift register and the output terminal Output (N+1) of the next level shift register at high levels.

In the above steps, the OFF signal terminal Vss is continuously at a high level, one of the first signal terminal Vdd1 and the second signal terminal Vdd2 is at a high level, and the other is at a low level.

That is, since states of a turned-on signal and a turned-off signal for a P-type transistor are opposite to those for an N-type transistor, in a shift register employing a P-type transistor, signals provided by all the terminals should be opposite to those in a shift register employing an N-type transistor, in this way, the operating state of the shift register can remain unchanged, thus detailed description of detailed processes thereof is omitted herein.

Third Embodiment

Figure 6:
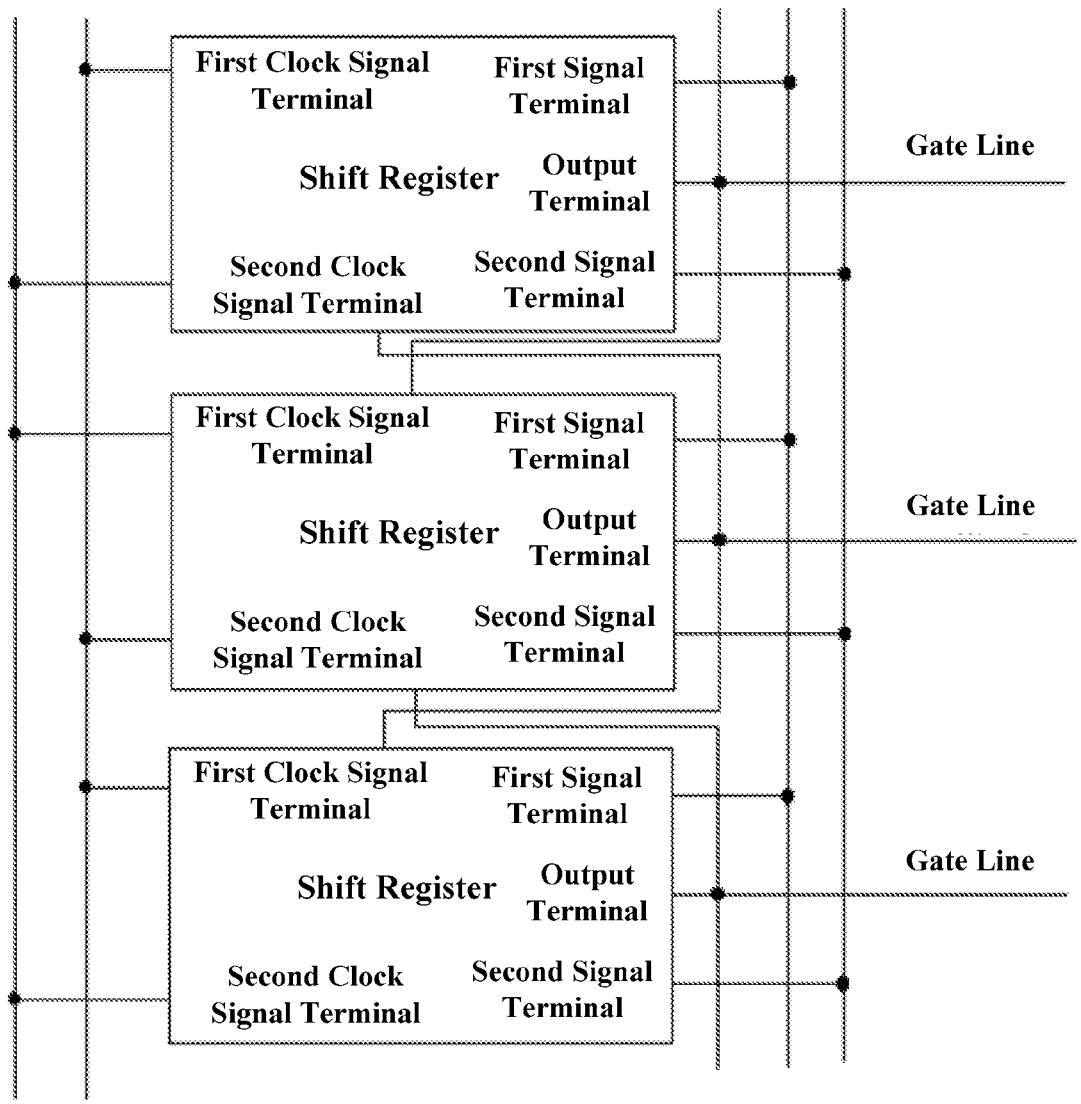
FIG. 6 is a block diagram of a partial structure of a gate driving circuit of an embodiment of the present application.

As shown in FIG. 6, the present embodiment provides a gate driving circuit, including a plurality of cascaded shift registers described above.

That is, a plurality of the above shift registers can be cascaded to form a gate driving circuit for driving a gate.

Specifically, the output terminal of each shift register is connected to a gate line, to provide a driving signal to this gate line. At the same time, the output terminal of each shift register is also connected to a previous level shift register and a next level shift register, as a part of their inputs. Of course, for the first and last shift registers of the whole circuit, since there is no previous level or next level shift register, corresponding input terminal thereof may be connected to a separate signal terminal.

The first signal terminals, second signal terminals, first clock signal terminals, and second clock signal terminals of the plurality of shift registers may respectively be connected to same ports through lead wires, so as to provide a signal to the plurality of shift registers using one port. The output stage of each shift register (i.e. when outputting an ON signal) is the charging stage of the next level shift register thereof (i.e. when the previous level shift register is outputting an ON signal), and at this time the two shift registers must have opposite needs for signals of the first clock signal terminals and signals of the second clock signal terminals. Thus, same clock signal terminals of adjacent shift registers may be connected to different ports respectively. Since a specific method for cascading the shift registers is known, detailed description thereof is omitted herein.

Fourth Embodiment

The present embodiment provides a display device, including an array substrate, which includes the above gate driving circuit.

Specifically, the display device may be any product or component with a display function, such as a liquid crystal display panel, an electronic paper, an OLED panel, a mobile phone, a tablet computer, a TV, a monitor, a notebook computer, a digital photo frame, a navigator or the like.

It can be understood that the foregoing implementations are merely exemplary implementations used for describing the principle of the present application, but the present application is not limited thereto. Those of ordinary skill in the art may make various variations and modifications without departing from the spirit and essence of the present application, and these variations and modifications shall fall into the protection scope of the present application.

The invention claimed is:

1. A shift register, comprising a pull-up node, a first pull-down node, a second pull-down node, a first clock signal terminal, a second clock signal terminal, a first signal terminal, a second signal terminal, an OFF signal terminal, and an output terminal, wherein the shift register further comprises:
   an input module, used for introducing a signal of an output terminal of a previous level shift register to the pull-up node;
   an output module, used for introducing, based on an electrical level of the pull-up node, a signal of the first clock signal terminal to the output terminal;
   a reset module, used for resetting, under the control of a signal of an output terminal of a next level shift register, the pull-up node, the output terminal, the first pull-down node, and the second pull-down node using signals of the OFF signal terminal, the first signal terminal, and the second signal terminal;
   a voltage setting module, for introducing, based on an electrical level of the pull-up node, a signal of the OFF signal terminal to the first pull-down node and the second pull-down node; and
   a holding module, for introducing, under the control of the second clock signal terminal, signals of the first signal terminal and the second signal terminal to the first pull-down node and the second pull-down node, respectively, so as to introduce a signal of the OFF signal terminal to the pull-up node and the output terminal.

2. The shift register of claim 1, wherein
parasitic resistance of two transistors in the voltage setting module is smaller than respective parasitic resistance of two transistors in the holding module.

3. The shift register of claim 2, wherein
all of the transistors are N-type transistors.

4. A driving method of a shift register, wherein the shift register is the shift register of claim 3, the driving method of a shift register comprising:
   in a charging stage, introducing a signal of the output terminal of the previous level shift register to the pull-up node by the input module;
   in an output stage, introducing a signal of the first clock signal terminal to the output terminal by the output module, so that the output terminal outputs an ON signal;
   in a reset stage, resetting the pull-up node, the output terminal, the first pull-down node, and the second pull-down node using signals of the OFF signal terminal, the first signal terminal, and the second signal terminal by the reset module; and
   in a holding stage, introducing a signal of the OFF signal terminal to the pull-up node and the output terminal by the holding module, so that the output terminal continuously outputs an OFF signal.

5. The driving method of a shift register of claim 4, further comprising:
   in the charging stage, setting the first clock signal terminal at a low level, the second clock signal terminal at a high level, the output terminal of the previous level shift register at a high level, and the output terminal of the next level shift register at a low level;
   in the output stage, setting the first clock signal terminal at a high level, the second clock signal terminal at a low level, the output terminal of the previous level shift register at a low level, and the output terminal of the next level shift register at a low level;
   in the reset stage, setting the first clock signal terminal at a low level, the second clock signal terminal at a high level, the output terminal of the previous level shift register at a low level, and the output terminal of the next level shift register at a high level; and
   in the holding stage, setting the output terminal of the previous level shift register and the output terminal of the next level shift register at low levels,
   wherein, in the above steps, the OFF signal terminal is continuously at a low level, and one of the first signal terminal and the second signal terminal is at a high level, the other at a low level.

6. The driving method of a shift register of claim 5, further comprising:
a step of switching the level of the first signal terminal and the level of the second signal terminal, such that one of the first signal terminal and the second signal terminal that is at a high level becomes at a low level, and the other that is at a low level becomes at a high level.

7. The shift register of claim 2, wherein
all of the transistors are P-type transistors.

8. A driving method of a shift register, wherein the shift register is the shift register of claim 7, the driving method of a shift register comprising:
in a charging stage, introducing a signal of the output terminal of the previous level shift register to the pull-up node by the input module;
in an output stage, introducing a signal of the first clock signal terminal to the output terminal by the output module, so that the output terminal outputs an ON signal;
in a reset stage, resetting the pull-up node, the output terminal, the first pull-down node, and the second pull-down node using signals of the OFF signal terminal, the first signal terminal, and the second signal terminal by the reset module; and
in a holding stage, introducing a signal of the OFF signal terminal to the pull-up node and the output terminal by the holding module, so that the output terminal continuously outputs an OFF signal.

9. The driving method of a shift register of claim 8, further comprising:
in the charging stage, setting the first clock signal terminal at a high level, the second clock signal terminal at a low level, the output terminal of the previous level shift register at a low level, and the output terminal of the next level shift register at a high level;
in the output stage, setting the first clock signal terminal at a low level, the second clock signal terminal at a high level, the output terminal of the previous level shift register at a high level, and the output terminal of the next level shift register at a high level;
in the reset stage, setting the first clock signal terminal at a high level, the second clock signal terminal at a low level, the output terminal of the previous level shift register at a high level, and the output terminal of the next level shift register at a low level; and
in the holding stage, setting the output terminal of the previous level shift register and the output terminal of the next level shift register at high levels,
wherein, in the above steps, the OFF signal terminal is continuously at a high level, and one of the first signal terminal and the second signal terminal is at a high level, the other at a low level.

10. The driving method of a shift register of claim 9, further comprising:
a step of switching the level of the first signal terminal and the level of the second signal terminal, such that one of the first signal terminal and the second signal terminal that is at a high level becomes at a low level, and the other that is at a low level becomes at a high level.

11. A gate driving circuit, comprising a plurality of cascaded shift registers, wherein
the shift register is the shift register of claim 1.

12. A display device, comprising an array substrate, wherein
the array substrate comprises the gate driving circuit of claim 11.

13. A driving method of a shift register, wherein the shift register is the shift register of claim 1, the driving method of a shift register comprising:
in a charging stage, introducing a signal of the output terminal of the previous level shift register to the pull-up node by the input module;
in an output stage, introducing a signal of the first clock signal terminal to the output terminal by the output module, so that the output terminal outputs an ON signal;
in a reset stage, resetting the pull-up node, the output terminal, the first pull-down node, and the second pull-down node using signals of the OFF signal terminal, the first signal terminal, and the second signal terminal by the reset module; and
in a holding stage, introducing a signal of the OFF signal terminal to the pull-up node and the output terminal by the holding module, so that the output terminal continuously outputs an OFF signal.

* * * * *